US011169895B2

(12) United States Patent
Becht et al.

(10) Patent No.: US 11,169,895 B2
(45) Date of Patent: Nov. 9, 2021

(54) EMULATION LATCH TO CAPTURE STATE

(71) Applicant: International Business Machines Corporation, Armonk, NY (US)

(72) Inventors: Michael James Becht, Poughkeepsie, NY (US); Pasquale A. Catalano, Wallkill, NY (US); Stephen Robert Guendert, Poughkeepsie, NY (US); Christopher J Colonna, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/773,002

(22) Filed: Jan. 27, 2020

(65) Prior Publication Data

US 2021/0232471 A1    Jul. 29, 2021

(51) Int. Cl.
*G06F 30/30* (2020.01)
*G06F 11/26* (2006.01)
*G06F 11/263* (2006.01)
*G06F 30/33* (2020.01)

(52) U.S. Cl.
CPC .......... *G06F 11/261* (2013.01); *G06F 11/263* (2013.01); *G06F 30/33* (2020.01)

(58) Field of Classification Search
CPC ....... G06F 11/261; G06F 30/33; G06F 11/263
USPC ........................................................ 716/106
See application file for complete search history.

(56) References Cited

U.S. PATENT DOCUMENTS

| | | | | |
|---|---|---|---|---|
| 5,177,440 A | * | 1/1993 | Walker, III | G01R 31/31937 714/736 |
| 5,809,559 A | * | 9/1998 | Kim | G06F 11/261 711/202 |
| 7,392,165 B2 | * | 6/2008 | Nixon | G06F 11/261 703/7 |
| 7,826,282 B2 | * | 11/2010 | Schmitt | G11C 7/10 365/189.17 |

(Continued)

FOREIGN PATENT DOCUMENTS

| | | |
|---|---|---|
| EP | 1600865 A1 | 11/2005 |
| JP | 6600011 B2 | 10/2019 |
| WO | 2015181389 A2 | 12/2015 |

OTHER PUBLICATIONS

Cheng, X., et al., "A Run-Time RTL Debugging Methodology for FPGA-based Co-Simulation," 2010 International Conference on Communications, Circuits and Systems (ICCCAS), pp. 891-895, IEEE, 2010.

(Continued)

*Primary Examiner* — Jack Chiang
*Assistant Examiner* — Brandon Bowers
(74) *Attorney, Agent, or Firm* — Donald G. Weiss

(57) ABSTRACT

In an approach to simulating an electronic device, a copy of a design under test is created. A delayed buffer for the copy is created, where the inputs to the design under test are stored in the delayed buffer. A test program is run on the design under test and the copy, where the test program running on the copy is delayed in time by the delayed buffer. Responsive to determining that an event has occurred on the design under test, the test program on the copy is halted. The cause of the event is determined by using the inputs stored in the delayed buffer to scan the copy.

20 Claims, 4 Drawing Sheets

(56) References Cited

U.S. PATENT DOCUMENTS

| | | | |
|---|---|---|---|
| 7,930,162 B1* | 4/2011 | Chan | G06F 30/331 |
| | | | 703/14 |
| 7,930,165 B2 | 4/2011 | Weiss | |
| 2009/0106604 A1* | 4/2009 | Lange | G06F 11/261 |
| | | | 714/45 |
| 2013/0116976 A1* | 5/2013 | Kanemasa | G06F 11/3419 |
| | | | 702/186 |
| 2017/0269136 A1 | 9/2017 | Xiaoning | |

OTHER PUBLICATIONS

IBM Appendix P, "List of IBM Patent Applications to be Treated as Related", Dated Herewith, 2 pages.

* cited by examiner

EMULATION LATCH TO CAPTURE STATE

BACKGROUND

The present invention relates generally to the field of simulating an electronic device, and more particularly to using an emulation latch to capture state.

In integrated circuit design, hardware emulation is the process of debugging and functional verification of the system under development. The emulation model is usually based on a hardware description language (e.g., Verilog) source code, which is compiled into the format used by the emulation system. Comprehensive hardware functional verification is critical to reduce development cost and time-to-market. Emulation provides quick bring-up and quick turn-around time when processing design changes. Also, emulation provides high design accessibility and debug visibility so that designers of application-specific integrated circuits (ASICs) can catch potential hardware failures before the tape out.

SUMMARY

Embodiments of the present invention disclose a method, a computer program product, and a system for simulating an electronic device. In one embodiment, a copy of a design under test is created. A delayed buffer for the copy is created, where the inputs to the design under test are stored in the delayed buffer. A test program is run on the design under test and the copy, where the test program running on the copy is delayed in time by the delayed buffer. Responsive to determining that an event has occurred on the design under test, the test program on the copy is halted. The cause of the event is determined by using the inputs stored in the delayed buffer to scan the copy.

DETAILED DESCRIPTION

In the design of ASICs, respins and steppings are due at least in part to functional errors and bugs inadvertently introduced at the register-transfer level (RTL) stage of the design process. In addition, as software complexity and cost are drastically increasing, early hardware verification is essential to lower risk and accelerate system development. Therefore, comprehensive functional verification is key to reducing development costs and delivering a product on time. Functional verification of a design is most often performed using logic simulation and/or prototyping on field-programmable gate arrays (FPGAs).

ASIC prototyping using FPGAs consists of implementing a portion or the totality of an ASIC design into one or more FPGAs in order to validate its functionality. This operation is particularly effective for testing features that are unable to be verified using simulation.

One way to overcome some of these limitations is to create a low-cost prototype of the entire ASIC under development, or some subsystems of the ASIC, and exercise its functionalities before entering the manufacturing process. Using commercially available FPGA-based platforms, it is possible to create such prototypes.

Multiple ASICs utilize emulation platforms to great lengths to verify the logic within the chip, but along the way a few notable weaknesses have appeared. Reprogramming an issue was difficult. The emulation platform uses a real-world environment that causes random events. This means that the same error event might not be seen for days or even weeks. Input-output (I/O) chips in general require a long runtime, typically over 8 hours, to verify the integrity of the chip. Getting trace or advanced event triggering (AET) events was very limited. Every new signal that needed to be added required a rebuild of the FPGAs and a reproduction of the issue, which could take days to reproduce.

Embodiments of the present invention provide a solution by creating a copy of the design under test (DUT) with a delayed buffer that captures the inputs into the original DUT. Once the copy of the DUT is created, along with the delayed buffer, the operating system or application is run as normal. The DUT will receive the inputs and generate the corresponding output. At the same time, the delayed buffer is being loaded, and the copy of the DUT receives the inputs and generates the same corresponding output as the DUT, but delayed in time. When an event occurs, for example, an error or a start of packet, the delayed buffer will stop loading. If the depth of the delayed buffer is sufficient, the operations that triggered the event will not yet have been executed in the copy of the DUT, so a user via a user interface can step through the operations in the copy of the DUT that caused the event in the original DUT, and utilize scan to get an infinitely large AET or trace to debug the problem.

The present invention will now be described in detail with reference to the Figures.

Figure 1:
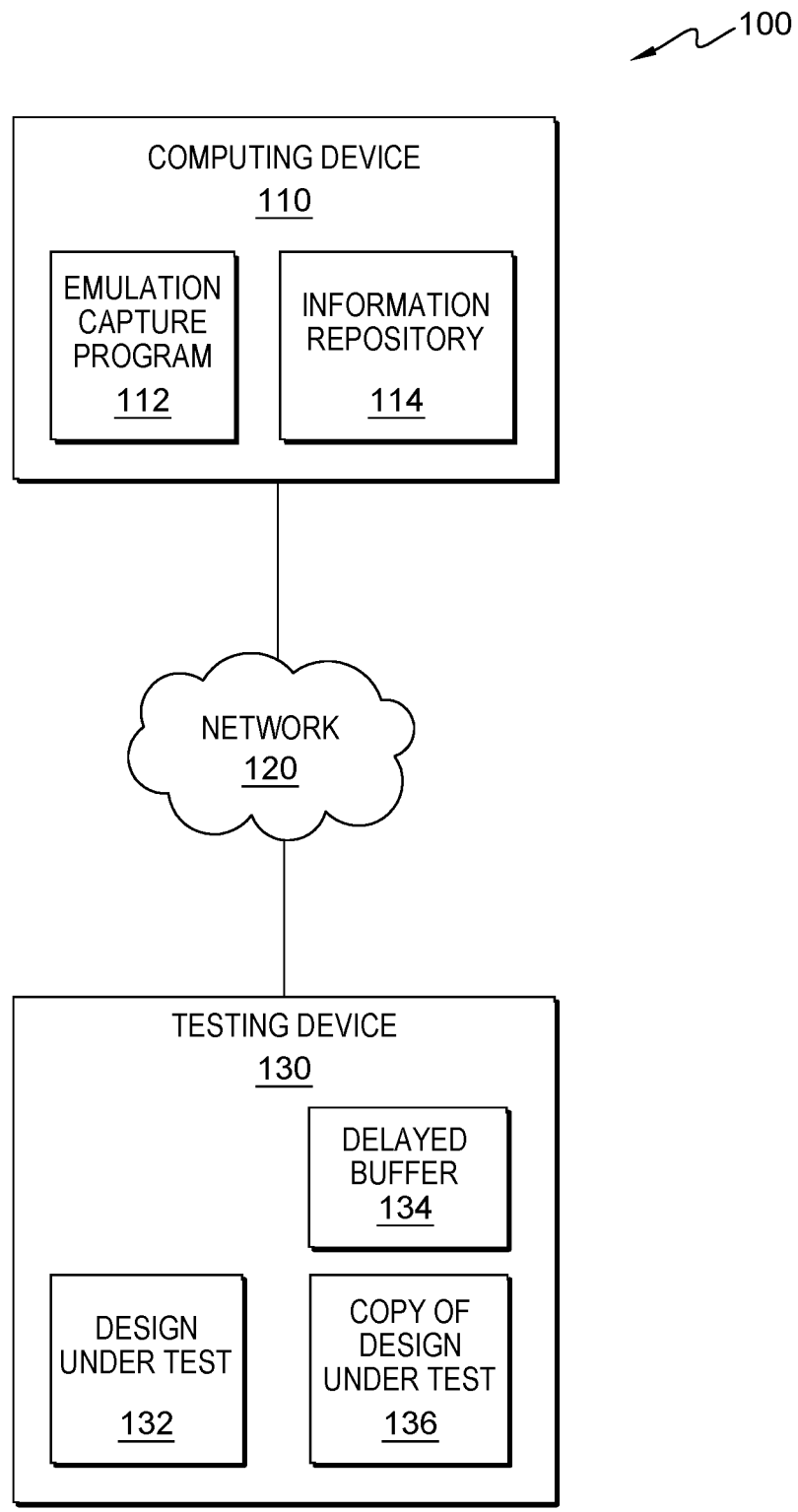
FIG. 1 is a functional block diagram illustrating a distributed data processing environment, in accordance with an embodiment of the present invention.

FIG. 1 is a functional block diagram illustrating a distributed data processing environment, generally designated 100, suitable for operation of emulation capture program 112 in accordance with at least one embodiment of the present invention. The term "distributed" as used herein describes a computer system that includes multiple, physically distinct devices that operate together as a single computer system. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims.

Distributed data processing environment 100 includes computing device 110 and testing device 130, both connected to network 120. Network 120 can be, for example, a telecommunications network, a local area network (LAN), a wide area network (WAN), such as the Internet, or a combination of the three, and can include wired, wireless, or fiber optic connections. Network 120 can include one or more wired and/or wireless networks that are capable of receiving and transmitting data, voice, and/or video signals, including multimedia signals that include voice, data, and video information. In general, network 120 can be any combination of connections and protocols that will support communications between computing device 110 and other computing devices (not shown) within distributed data processing environment 100.

Computing device 110 can be a standalone computing device, a management server, a web server, a mobile computing device, or any other electronic device or computing system capable of receiving, sending, and processing data. In an embodiment, computing device 110 can be a laptop computer, a tablet computer, a netbook computer, a personal computer (PC), a desktop computer, a personal digital assistant (PDA), a smart phone, or any programmable electronic device capable of communicating with other computing devices (not shown) within distributed data processing environment 100 via network 120. In another embodiment, computing device 110 can represent a server computing system utilizing multiple computers as a server system, such as in a cloud computing environment. In yet another embodiment, computing device 110 represents a computing system utilizing clustered computers and components (e.g., database server computers, application server computers, etc.) that act as a single pool of seamless resources when accessed within distributed data processing environment 100.

In an embodiment, computing device 110 includes emulation capture program 112. In an embodiment, emulation capture program 112 is a program, application, or subprogram of a larger program for capturing state in an emulation latch. In an alternative embodiment, emulation capture program 112 may be located on any other device accessible by computing device 110 via network 120. Emulation capture program 112 is described in more detail in FIG. 3.

In an embodiment, computing device 110 includes information repository 114. In an embodiment, information repository 114 may be managed by emulation capture program 112. In an alternate embodiment, information repository 114 may be managed by the operating system of the device, alone, or together with, emulation capture program 112. Information repository 114 is a data repository that can store, gather, compare, and/or combine information. In some embodiments, information repository 114 is located externally to computing device 110 and accessed through a communication network, such as network 120. In some embodiments, information repository 114 is stored on computing device 110. In some embodiments, information repository 114 may reside on another computing device (not shown), provided that information repository 114 is accessible by computing device 110. Information repository 114 includes, but is not limited to, user data, event data, FPGA configuration data, delayed buffer storage data, data associated with the normal test program, other data that is received by emulation capture program 112 from one or more sources, and data that is created by emulation capture program 112. In an embodiment, information repository 114 includes trace data for the external interfaces of DUT 132. For example, the trace data may include Peripheral Component Interconnect Express (PCIe) trace data that are sent to, and received from, DUT 132.

Information repository 114 may be implemented using any volatile or non-volatile storage media for storing information, as known in the art. For example, information repository 114 may be implemented with a tape library, optical library, one or more independent hard disk drives, multiple hard disk drives in a redundant array of independent disks (RAID), solid-state drives (SSD), or random-access memory (RAM). Similarly, information repository 114 may be implemented with any suitable storage architecture known in the art, such as a relational database, an object-oriented database, or one or more tables.

Distributed data processing environment 100 includes testing device 130. Testing device 130 includes DUT 132, delayed buffer 134, and copy DUT 136. Testing device 130 and its components are described in more detail in FIG. 2.

Figure 2:
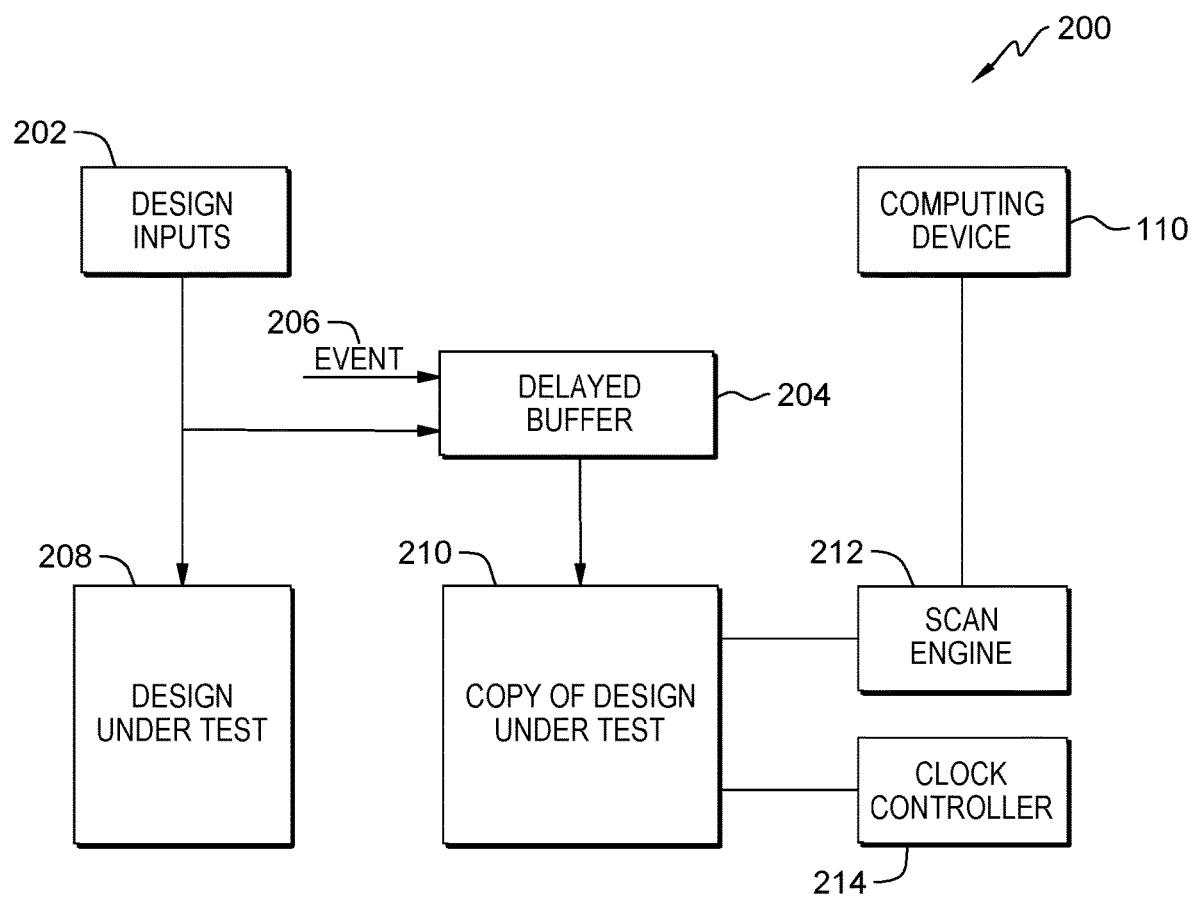
FIG. 2 is a block diagram of an example of an emulation latch to capture state, in accordance with an embodiment of the present invention.

FIG. 2 is an example of one possible embodiment of testing device 130, generally designated 200. The design inputs 202 represent the various possible inputs received by DUT 208. In an embodiment, the design inputs 202 are signals received by DUT 208, such as hardware signals. In another embodiment, the design inputs 202 are instructions received by testing device 130 from computing device 110 over network 120. In yet another embodiment, the design inputs 202 may be any combination of hardware signals and software instructions that are received by testing device 130 as necessary for the functional testing of DUT 208.

In an embodiment, DUT 208 is implemented in one or more FPGA devices. In another embodiment, DUT 208 is implemented in discrete hardware. In yet another embodiment, DUT 208 is implemented as a software simulation of the ASIC RTL code, e.g., Verilog or Very High Speed Integrated Circuit-Hardware Description Language (VHDL). In an embodiment, the design inputs 202 are received directly by DUT 208.

The design inputs 202 are also received by delayed buffer 204. Delayed buffer 204 is a memory buffer that stores all inputs received by DUT 208. Delayed buffer 204 creates a time delay between the time that the inputs are received by DUT 208 and when the identical inputs are received by copy DUT 210. In an embodiment, the time delay between the inputs received by DUT 208 and the identical inputs received by copy DUT 210 are programmable by a user of computing device 110. In another embodiment, the time delay between the inputs received by DUT 208 and the identical inputs received by copy DUT 210 are established by the size of the memory of delayed buffer 204.

In an embodiment, delayed buffer 204 is implemented in internal memory, such as FPGA block random-access memory (RAM). In another embodiment, delayed buffer 204 is implemented in external memory, e.g., double data rate (DDR) RAM. In yet another embodiment, delayed buffer 204 is implemented in information repository 114 on computing device 110. Delayed buffer 204 may be implemented using any form of memory as may be appropriate as would be recognized by a person of skill in the art.

Event 206, which is received by testing device 130, signals the occurrence of some event of interest to the user testing DUT 208. In an embodiment, event 206 may be, for example, an error condition, a start of packet signal, or a packet header. In an embodiment, the receipt of event 206 will cause delayed buffer 204 to stop storing inputs from the design inputs 202.

Copy DUT 210 is functionally identical to DUT 208. In an embodiment, the inputs received by DUT 208 are delayed by delayed buffer 204 and then, after a programmable time delay, copy DUT 210 receives the identical inputs that were previously received by DUT 208. In this way, copy DUT 210 performs the same operations, and generates the same results, as DUT 208, but at a later time. This allows the system to halt the loading of delayed buffer 204 when event 206 occurs, to enable copy DUT 210 to be single-stepped, or otherwise analyzed, by the user via a user interface on computing device 110.

In an embodiment, when event 206 is detected and delayed buffer 204 stops storing inputs from the design inputs 202, the control of copy DUT 210 is transferred to computing device 110. In an embodiment, computing device 110 controls copy DUT 210 via a scan engine 212 and a clock controller 214. In an embodiment, the scan engine 212 allows computing device 110 to control the operation of copy DUT 210 during the debugging operation. In an embodiment, the scan engine 212 allows the user via a user interface on computing device 110 to read the state of copy DUT 210 at any point. In an embodiment, the clock controller 214 allows the user via a user interface on computing device 110 to step through the execution of copy DUT 210. In an embodiment, the clock controller 214 allows the user via a user interface on computing device 110 to single step the operation of copy DUT 210 by generating one clock pulse per command from computing device 110. In another embodiment, the clock controller 214 can generate any number of clock pulses via commands from the user via a user interface on computing device 110.

Figure 3:
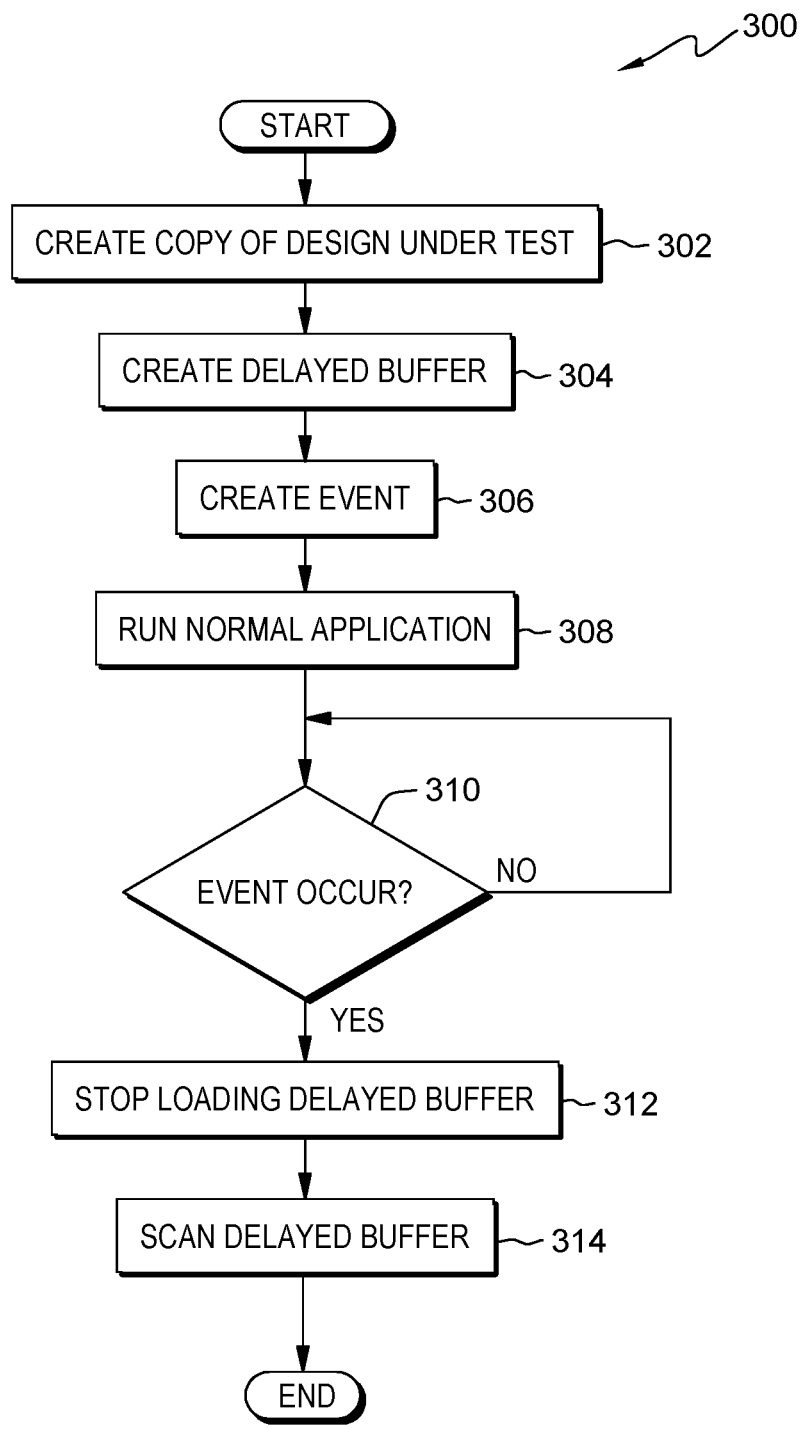
FIG. 3 is a flowchart depicting operational steps of an emulation capture program, on a computing device within the distributed data processing environment of FIG. 1, for capturing state in an emulation latch, in accordance with an embodiment of the present invention.

FIG. 3 is a flow chart diagram of workflow 300 depicting operational steps for emulation capture program 112 for capturing state in an emulation latch, in accordance with at least one embodiment of the invention. In an alternative embodiment, the steps of workflow 300 may be performed by any other program while working with emulation capture program 112. In an embodiment, emulation capture program 112 creates a copy of the DUT. In an embodiment, emulation capture program 112 create a delayed buffer. In an embodiment, emulation capture program 112 runs the normal application. In an embodiment, emulation capture program 112 determines if an event setup by a user has occurred. In an embodiment, if emulation capture program 112 determines that the event setup by the user has occurred, then emulation capture program 112 stops loading delayed buffer 204. In an embodiment, the user via a user interface on computing device 110 scans delayed buffer 204 via emulation capture program 112.

It should be appreciated that embodiments of the present invention provide at least for capturing state in an emulation latch. However, FIG. 3 provides only an illustration of one implementation and does not imply any limitations with regard to the environments in which different embodiments may be implemented. Many modifications to the depicted environment may be made by those skilled in the art without departing from the scope of the invention as recited by the claims.

Emulation capture program 112 creates a copy of the DUT (step 302). In an embodiment, emulation capture program 112 creates copy DUT 210 to duplicate the functionality of DUT 208. In an embodiment, emulation capture program 112 creates copy DUT 210 by loading the identical configuration into one or more FPGAs in copy DUT 210 as are loaded into the one or more FPGAs in DUT 208. In an embodiment, emulation capture program 112 loads the test software and the test cases for the test software into DUT 208 and copy DUT 210.

Emulation capture program 112 creates a delayed buffer (step 304). In an embodiment, emulation capture program 112 creates delayed buffer 204 in the block RAM of the one or more FPGAs in copy DUT 210. In another embodiment, emulation capture program 112 creates delayed buffer 204 in external RAM, for example, DDR memory. In yet another embodiment, emulation capture program 112 creates delayed buffer 204 in information repository 114 of computing device 110. In an embodiment, emulation capture program 112 creates delayed buffer 204 using any appropriate storage mechanism as would be known to a person of skill in the art.

Emulation capture program 112 creates an event (step 306). In an embodiment, emulation capture program 112 creates event 206 to trigger emulation capture program 112 to stop delayed buffer 204 from storing any additional input when event 206 is detected. In an embodiment, event 206 can be a hardware event. In another embodiment, event 206 can be a software event. In an embodiment, event 206 is created in response to receiving an input from the user on computing device 110. In another embodiment, event 206 is a default event.

In an embodiment, event 206 is an error condition generated by DUT 208. The error condition may be, for example, an output signal from DUT 208. In another example, event 206 occurs when a specific combination of output signals, or pattern of output signals, is detected from DUT 208. In another embodiment, event 206 is triggered when a particular memory location in DUT 208 becomes a particular value. For example, when a particular memory location in DUT 208 is written with the value 088H, generate event 206. In an embodiment, event 206 is an event detected from hardware, for example, a start of packet indication on a connected network. In yet another embodiment, event 206 can be any appropriate signal that that aids in the testing and debugging of DUT 208.

Emulation capture program 112 runs the normal application (step 308). In an embodiment, emulation capture program 112 runs the application that normally runs on DUT 208. For example, the normal application may be the operating system that normally runs on DUT 208. In another example, the normal application may be an application run by a user of the system incorporating DUT 208. In an embodiment, emulation capture program 112 runs a test program instead of, or in addition to, the normal application. In another embodiment, the normal application is an application program, with or without an underlying operating system. In yet another embodiment, the normal application includes hardware inputs.

Emulation capture program 112 determines if an event occurred (decision block 310). At step 310, emulation capture program 112 determines if event 206 has occurred. In an embodiment, emulation capture program 112 determines that event 206 has occurred by receiving an interrupt from delayed buffer 204. In another embodiment, emulation capture program 112 determines that event 206 has occurred by monitoring event 206 on computing device 110, via scan engine 212. If emulation capture program 112 determines that event 206 has occurred ("yes" branch, decision block 310), then emulation capture program 112 continues to step 312. If emulation capture program 112 determines that event 206 has not occurred ("no" branch, decision block 310), then emulation capture program 112 returns to step 310.

Emulation capture program 112 stops loading the delayed buffer (step 312). At step 312, emulation capture program 112 prevents delayed buffer 204 from storing additional inputs, in order to preserve the state of copy DUT 210 as a delayed version of the state of DUT 208. This allows the user via the user interface on computing device 110 to step through the operation of copy DUT 210 to the point where event 206 (e.g., the error) occurred on DUT 208 in order to debug the issue that caused event 206.

Emulation capture program 112 scans the delayed buffer (step 314). At step 314, emulation capture program 112 uses scan engine 212 and clock controller 214 to enable the user via the user interface to scan copy DUT 210 to locate the condition that caused the event. In an embodiment, emulation capture program 112 uses scan engine 212 and clock controller 214 to enable the user via the user interface to single step through the operation of copy DUT 210 one operational step at a time. In an embodiment, emulation capture program 112 uses scan engine 212 and clock controller 214 to enable the user via the user interface to scan copy DUT 210 to locate any issue that may have caused event 206. For example, emulation capture program 112 uses scan engine 212 and clock controller 214 to enable the user via the user interface to view trace or AET events. In an embodiment, emulation capture program 112 uses clock controller 214 to step through the operation of copy DUT 210 by any number of operations of copy DUT 210 that the user deems necessary to locate the condition that caused event 206.

Figure 4:
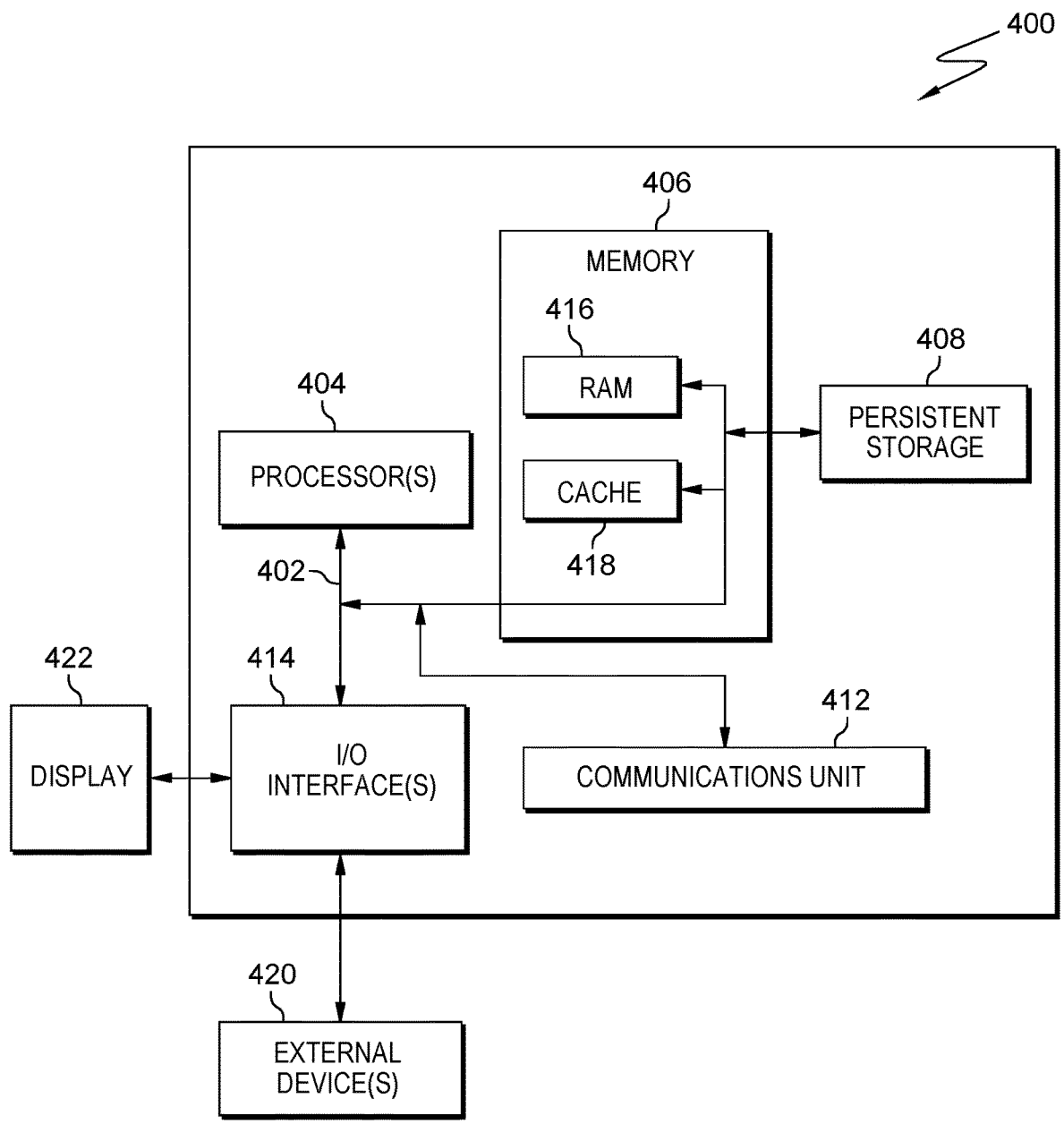
FIG. 4 depicts a block diagram of components of computing devices executing the emulation capture program within the distributed data processing environment of FIG. 1, in accordance with an embodiment of the present invention.

FIG. 4 is a block diagram depicting components of computing device 110 suitable for emulation capture program 112, in accordance with at least one embodiment of the invention. FIG. 4 displays computer 400, one or more processor(s) 404 (including one or more computer processors), communications fabric 402, memory 406 including, RAM 416, and cache 418, persistent storage 408, communications unit 412, I/O interfaces 414, display 422, and external devices 420. It should be appreciated that FIG. 4 provides only an illustration of one embodiment and does not imply any limitations with regard to the environments in which different embodiments may be implemented. Many modifications to the depicted environment may be made.

As depicted, computer 400 operates over communications fabric 402, which provides communications between the computer processor(s) 404, memory 406, persistent storage 408, communications unit 412, and input/output (I/O) interface(s) 414. Communications fabric 402 may be implemented with an architecture suitable for passing data or control information between processors 404 (e.g., microprocessors, communications processors, and network processors), memory 406, external devices 420, and any other hardware components within a system. For example, communications fabric 402 may be implemented with one or more buses.

Memory 406 and persistent storage 408 are computer readable storage media. In the depicted embodiment, memory 406 comprises RAM 416 and cache 418. In general, memory 406 can include any suitable volatile or non-volatile computer readable storage media. Cache 418 is a fast memory that enhances the performance of processor(s) 404 by holding recently accessed data, and near recently accessed data, from RAM 416.

Program instructions for emulation capture program 112 may be stored in persistent storage 408, or more generally, any computer readable storage media, for execution by one or more of the respective computer processors 404 via one or more memories of memory 406. Persistent storage 408 may be a magnetic hard disk drive, a solid-state disk drive, a semiconductor storage device, read only memory (ROM), electronically erasable programmable read-only memory (EEPROM), flash memory, or any other computer readable storage media that is capable of storing program instruction or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer readable storage medium that is also part of persistent storage 408.

Communications unit 412, in these examples, provides for communications with other data processing systems or devices. In these examples, communications unit 412 includes one or more network interface cards. Communications unit 412 may provide communications through the use of either or both physical and wireless communications links. In the context of some embodiments of the present invention, the source of the various input data may be physically remote to computer 400 such that the input data may be received, and the output similarly transmitted via communications unit 412.

I/O interface(s) 414 allows for input and output of data with other devices that may be connected to computer 400. For example, I/O interface(s) 414 may provide a connection to external device(s) 420 such as a keyboard, a keypad, a touch screen, a microphone, a digital camera, and/or some other suitable input device. External device(s) 420 can also include portable computer readable storage media such as, for example, thumb drives, portable optical or magnetic disks, and memory cards. Software and data used to practice embodiments of the present invention, e.g., emulation capture program 112, can be stored on such portable computer readable storage media and can be loaded onto persistent storage 408 via I/O interface(s) 414. I/O interface(s) 414 also connect to a display 422.

Display 422 provides a mechanism to display data to a user via the user interface and may be, for example, a computer monitor. Display 422 can also function as a touchscreen, such as a display of a tablet computer.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be any tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, FPGA, or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, a segment, or a portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer-implemented method for simulating an electronic device, the computer-implemented method comprising:
   creating, by a one or more computer processors, a complete copy of a design under test;
   creating, by the one or more computer processors, a delayed buffer for the copy, wherein inputs to the design under test are stored in the delayed buffer;
   running, by the one or more computer processors, a test program simultaneously on the design under test and the copy, wherein running the test program on the copy is delayed in time by the delayed buffer;
   responsive to determining that an event has occurred on the design under test, halting, by the one or more computer processors, both the design under test and the test program on the copy; and
   enabling, by the one or more computer processors, a user via a user interface to determine a cause of the event using the inputs stored in the delayed buffer to scan the copy.

2. The computer-implemented method of claim 1, wherein the delayed buffer is internal memory in the copy.

3. The computer-implemented method of claim 1, wherein the delayed buffer is memory external to the copy.

4. The computer-implemented method of claim 1, wherein the test program is a normal application for the device under test.

5. The computer-implemented method of claim 1, wherein the event is a hardware event.

6. The computer-implemented method of claim 1, wherein the event is a software event.

7. The computer-implemented method of claim 1, wherein the event is a memory pattern.

8. A computer program product for simulating an electronic device, the computer program product comprising one or more computer readable storage media and program instructions stored on the one or more computer readable storage media, the program instructions including instructions to:
   create a complete copy of a design under test;
   create a delayed buffer for the copy, wherein inputs to the design under test are stored in the delayed buffer;
   run a test program simultaneously on the design under test and the copy, wherein running the test program on the copy is delayed in time by the delayed buffer;
   responsive to determining that an event has occurred on the design under test, halt both the design under test and the test program on the copy; and
   enable a user via a user interface to determine a cause of the event using the inputs stored in the delayed buffer to scan the copy.

9. The computer program product of claim 8, wherein the delayed buffer is internal memory in the copy.

10. The computer program product of claim 8, wherein the delayed buffer is memory external to the copy.

11. The computer program product of claim 8, wherein the test program is a normal application for the device under test.

12. The computer program product of claim 8, wherein the event is a hardware event.

13. The computer program product of claim 8, wherein the event is a software event.

14. The computer program product of claim 8, wherein the event is a memory pattern.

15. A computer system for simulating an electronic device, the computer system comprising:
   one or more computer processors;
   one or more computer readable storage media; and
   program instructions stored on the one or more computer readable storage media for execution by at least one of the one or more computer processors, the stored program instructions including instructions to:
   create a complete copy of a design under test;
   create a delayed buffer for the copy, wherein inputs to the design under test are stored in the delayed buffer;
   run a test program simultaneously on the design under test and the copy, wherein running the test program on the copy is delayed in time by the delayed buffer;
   responsive to determining that an event has occurred on the design under test, halt both the design under test and the test program on the copy; and
   enable a user via a user interface to determine a cause of the event using the inputs stored in the delayed buffer to scan the copy.

16. The computer system of claim 15, wherein the delayed buffer is internal memory in the copy.

17. The computer system of claim 15, wherein the delayed buffer is memory external to the copy.

18. The computer system of claim 15, wherein the test program is a normal application for the device under test.

19. The computer system of claim 15, wherein the event is a hardware event.

20. The computer system of claim 15, wherein the event is a software event.

\* \* \* \* \*